(12) United States Patent
Sheu et al.

(10) Patent No.: US 7,105,803 B2
(45) Date of Patent: Sep. 12, 2006

(54) ROTARY OPTICAL ENCODER

(75) Inventors: Hong-Cheng Sheu, Chiayi (TW); Der-Seng Liang, Kaohsiung (TW)

(73) Assignee: Delta Electronics, Inc., Taoyuan Hsien (TW)

(*) Notice: Subject to any disclaimer, the term of this patent is extended or adjusted under 35 U.S.C. 154(b) by 62 days.

(21) Appl. No.: 10/873,116

(22) Filed: Jun. 23, 2004

(65) Prior Publication Data

US 2005/0199790 A1  Sep. 15, 2005

(30) Foreign Application Priority Data

Mar. 9, 2004  (TW) .............................. 93106186 A (51) Int. Cl.
*G01D 5/34* (2006.01)

(52) U.S. Cl. .......................... 250/231.16; 250/231.13; 250/231.14

(58) Field of Classification Search ................. 250/231.13–231.18, 237 G, 237 R
See application file for complete search history.

(56) References Cited

U.S. PATENT DOCUMENTS

| 4,650,993 A | * | 3/1987 | Boella et al. | .......... 250/231.14 |
| 5,644,127 A | * | 7/1997 | Ohmae | .................. 250/231.16 |
| 2005/0133705 A1 | * | 6/2005 | Hare | ...................... 250/231.13 |

* cited by examiner

*Primary Examiner*—Thanh X. Luu (57) ABSTRACT

A rotary optical encoder is described to provide the pole position of the rotor in a permanently magnetized motor. Using a simple opening design of code tracks and two light sensors along with a corresponding processing circuit, only one additional code track is required on the code wheel to output phase-changing signals. Thus the rotary optical encoder with phase-changing signal with low cost and small size is implemented.

13 Claims, 8 Drawing Sheets

| SOURCES | | | | INPUT | | | | | | OUTPUT | | | |
|---|---|---|---|---|---|---|---|---|---|---|---|---|---|
| V1 | V2 | Vref | V0 | S3 | S2 | S1 | S0 | Addres | UVW | Y0 | Y1 | Y2 | ... |
| 0 | 1 | 1.5 | 0.5 | 0 | 0 | 1 | 0 | 2 | VI | 0 | 0 | 1 | - |
| 0 | 0 | 1.5 | 0.5 | 0 | 0 | 0 | 0 | 0 | I | 1 | 0 | 1 | - |
| 1 | 0 | 1.5 | 0.5 | 0 | 0 | 0 | 1 | 1 | II | 1 | 0 | 0 | - |
| 2 | 0 | 1.5 | 0.5 | 0 | 1 | 0 | 1 | 5 | III | 1 | 0 | 0 | - |
| 2 | 1 | 1.5 | 0.5 | 0 | 1 | 1 | 1 | 7 | III | 1 | 1 | 0 | - |
| 2 | 2 | 1.5 | 0.5 | 1 | 1 | 1 | 1 | 15 | IV | 0 | 1 | 0 | - |
| 1 | 2 | 1.5 | 0.5 | 1 | 0 | 1 | 1 | 11 | V | 0 | 1 | 0 | - |
| 0 | 2 | 1.5 | 0.5 | 1 | 0 | 1 | 0 | 10 | VI | 0 | 0 | 1 | - |
| 0 | 1 | 1.5 | 0.5 | 0 | 0 | 1 | 0 | 2 | VI | 0 | 0 | 1 | - |

FIG. 8

ROTARY OPTICAL ENCODER

BACKGROUND OF THE INVENTION

1. Field of Invention

The invention relates to a rotary optical encoder and, in particular, to a rotary optical encoder with the function of outputting phase-changing signals.

2. Related Art

The rotary optical encoder is primarily used to detect the pole position of a rotor. It contains a light emitter, a light receiver, a code wheel and a code plate in between, and a processing circuit. By properly designing the pattern of code tracks on the code wheel and the code plate, one can readily obtain the required signal output.

The design of a normal servomotor usually uses a rotary optical encoder to detect its rotation position, speed, and direction. If the servomotor is brushless, Hall devices are traditionally used to provide the required rotor position signal so that the current on the stator can correctly change the phase. To save the space and lower the cost, the encoder manufacturers integrate the phase-changing function required by the brushless motor into the encoder. This can provide more accurate phase-changing signals.

Figure 1:
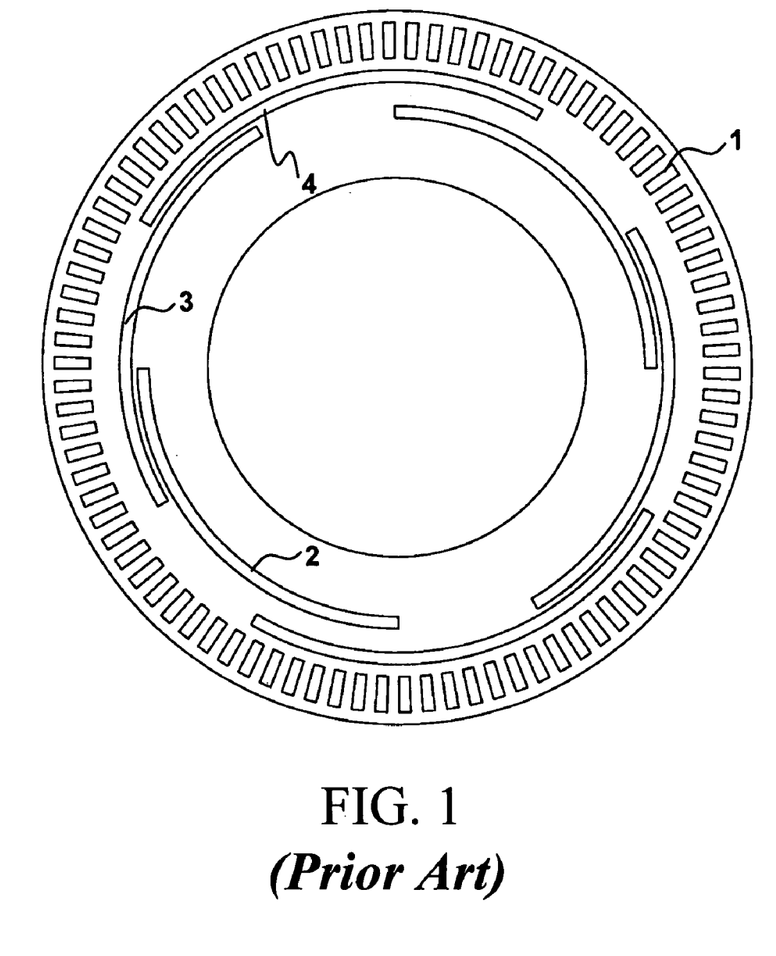
FIG. 1 is a schematic view of the code wheel of a rotary optical encoder with phase-changing signal output in the prior art.

With reference to FIG. 1, the normal rotary optical encoder with phase-changing signals usually has three extra tracks on the code wheel. Therefore, the code wheel contains dense slits 1 distributed at equal distance and interpolating code tracks 2, 3, 4 divided also at equal distance. The combination of these three code tracks provides the phase-changing signals on the current of the motor coil.

However, since there are three code tracks on the code wheel, three corresponding light sensors are required. The illumination area has to be increased in order to cover all the light sensors. This inevitably increases the space and cost of the encoder. Therefore, it is imperative to find a better encoder with the required phase-changing function but not the above-mentioned problems.

SUMMARY OF THE INVENTION

An objective of the invention is to solve the problems of increasing the space of code wheel, the light sensors, and the size of illumination source in order to increase the phase-changing signal output in the conventional rotary optical encoder.

In view of the foregoing, the invention provides a rotary optical encoder including a code wheel, a light emitter, and two light sensors along with a corresponding processing circuit. The code wheel has a code track that contains several regions, each of which has a first opening, a second opening, and a third opening and a sixth opening, a fifth opening, and a fourth opening that have symmetric relations with the aforementioned first three openings. When the code wheel rotates with the rotor, the light emitter projects a beam of light on the code wheel. The light sensors detect the photo intensity on the code wheel and convert using their processing circuits the intensity to phase-changing signals for output.

The disclosed code wheel contains a code track with simple openings. The code track contains several regions, each of which has a first opening, a second opening, a third opening, a fourth opening, a fifth opening, and a sixth opening. The first opening, the second opening, and the third opening are symmetric to the sixth opening, the fifth opening, and the fourth opening, respectively.

In accord with the above-mentioned rotary optical encoder and its code wheel, the invention further provides an encoding method for the rotary optical encoder. The method includes the steps of: the light emitter's projecting light on the code wheel; using two light sensors to detect the light intensity on the code wheel, receiving induced currents generated according to the light intensity detected by the light sensors; converting the induced currents into voltage signals; converting the voltage signals to a phase-changing signal; and outputting the phase-changing signal.

The invention achieves the goal of outputting phase-changing signal using only one additional code track on the code wheel and two light sensors along with a corresponding processing circuit. It also satisfies the requirements of small encoder space and low production cost.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 2:
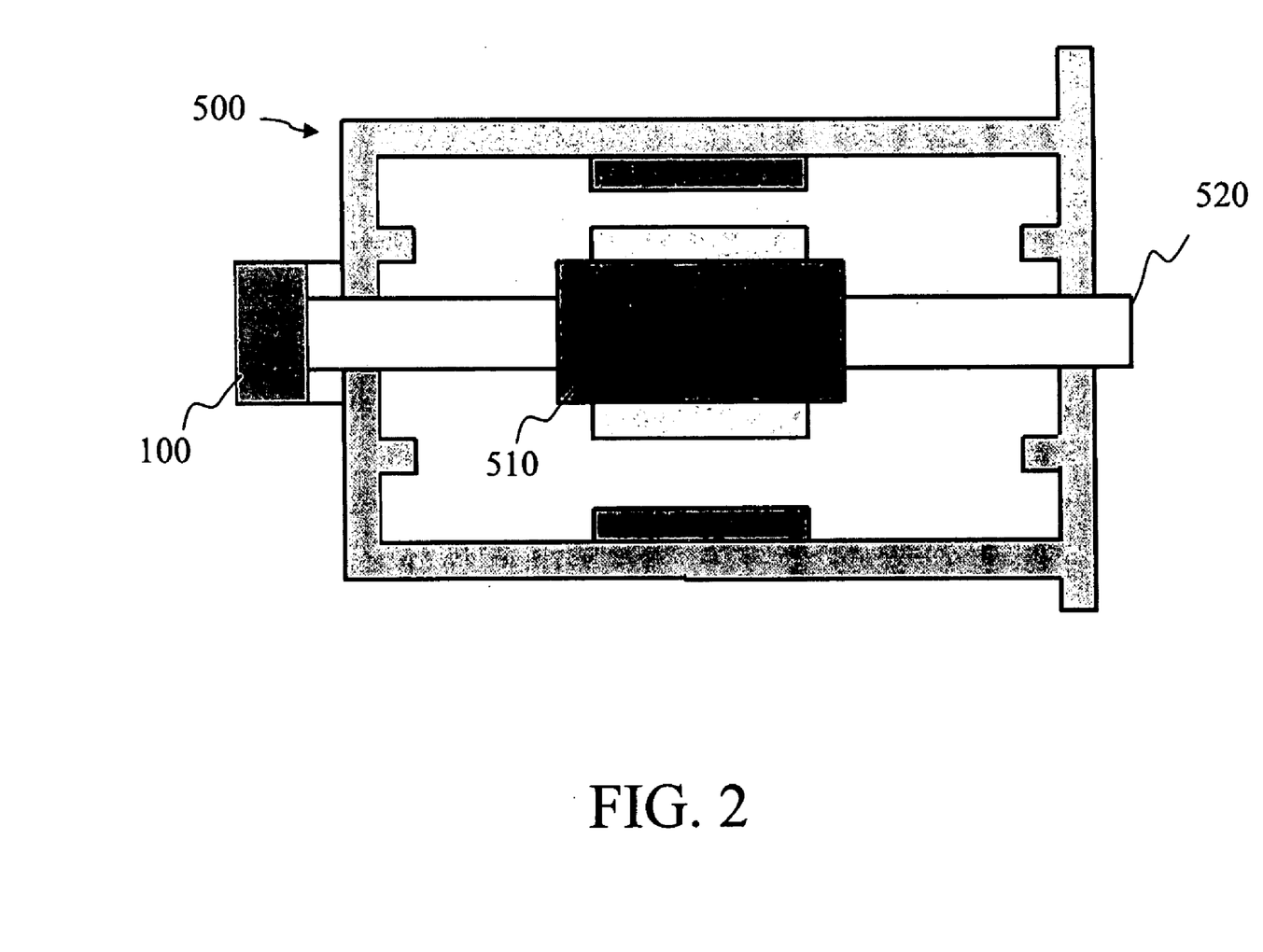
FIG. 2 is a schematic view of the disclosed rotary optical encoder used in a permanently magnetized motor.
Figure 3:
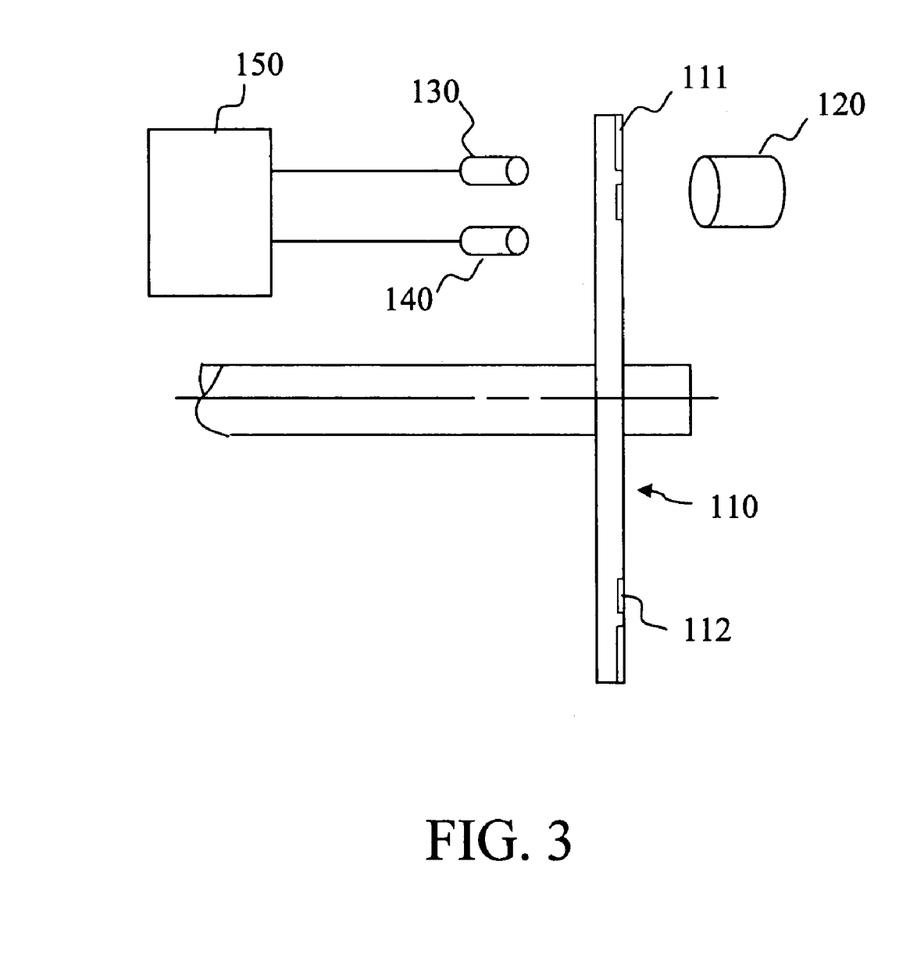
FIG. 3 is a schematic view of the disclosed rotary optical encoder.

As shown in FIGS. 2 and 3, the disclosed rotary optical encoder 100 is used in a permanently magnetized motor 500 in order to provide the pole position of the rotor 510. The rotary optical encoder 100 contains a light emitter 120, a code wheel 110, two light sensors 130, 140, and a processing circuit 150. The code wheel 110 is coupled to the rotating axis 520 of the permanently magnetized motor 500. When the rotor 510 rotates, the code wheel 110 is brought into rotation. The dense slits 111 and code track 112 regularly etched on the code wheel 110 are transparent. Both sides of the code wheel 110 are installed with a light emitter 120 and two light sensors 130, 140. As the code wheel 110 rotates, the light intensity received by the light sensors 130, 140 varies. The processing circuit 150 converts the light intensity into a phase-changing signal and outputs it as the reference for determining the position of the rotor 510.

Figure 4:
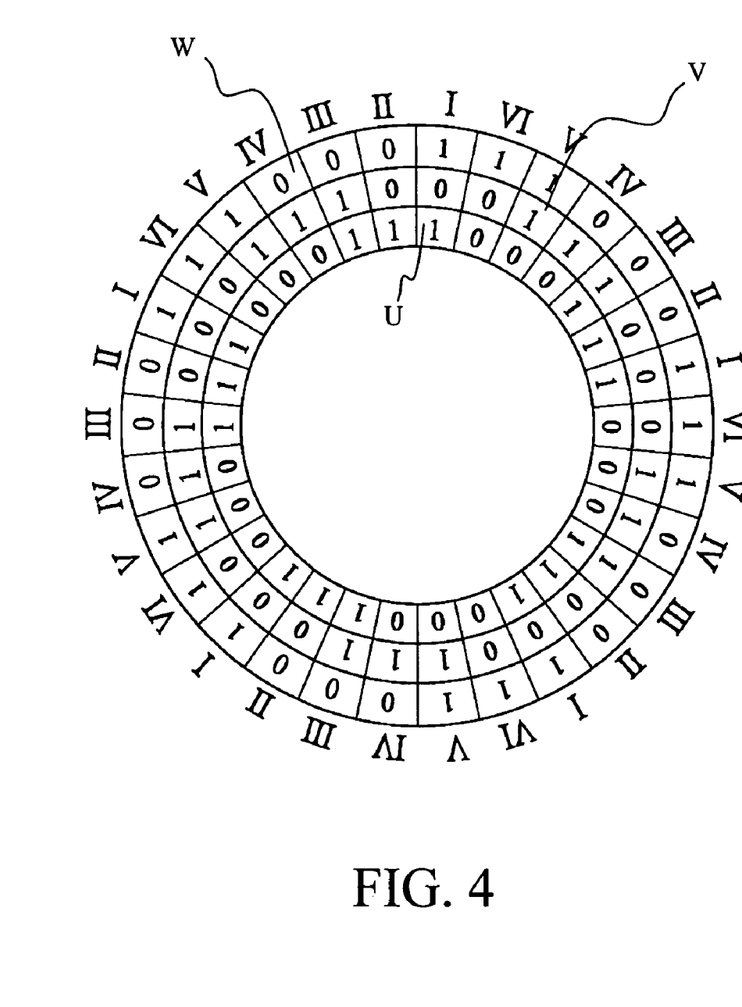
FIG. 4 shows the division of the code wheel for a rotor with ten poles and the distribution of phase-changing signals that achieve the division.

Generally speaking, for a permanently magnetized motor with a rotor with p poles, the encoder divides one cycle of the rotor into $360/(p*3)$ regions, each of which corresponds to a corresponding phase. Adjacent six regions form a group. The groups are assigned with independent codes and used repeatedly. There are totally $(p/2)$ groups. FIG. 4 shows a rotor with ten poles, the division of the code wheel, and the phase-changing signals (U,V,W) that achieve the division.

The disclosed rotary optical encoder 100 utilizes the pattern variation of the code track to have only one code track 112 on the code wheel 110 while achieving equivalent phase-changing signals using the conventional three-code-track code wheel.

Figure 5:
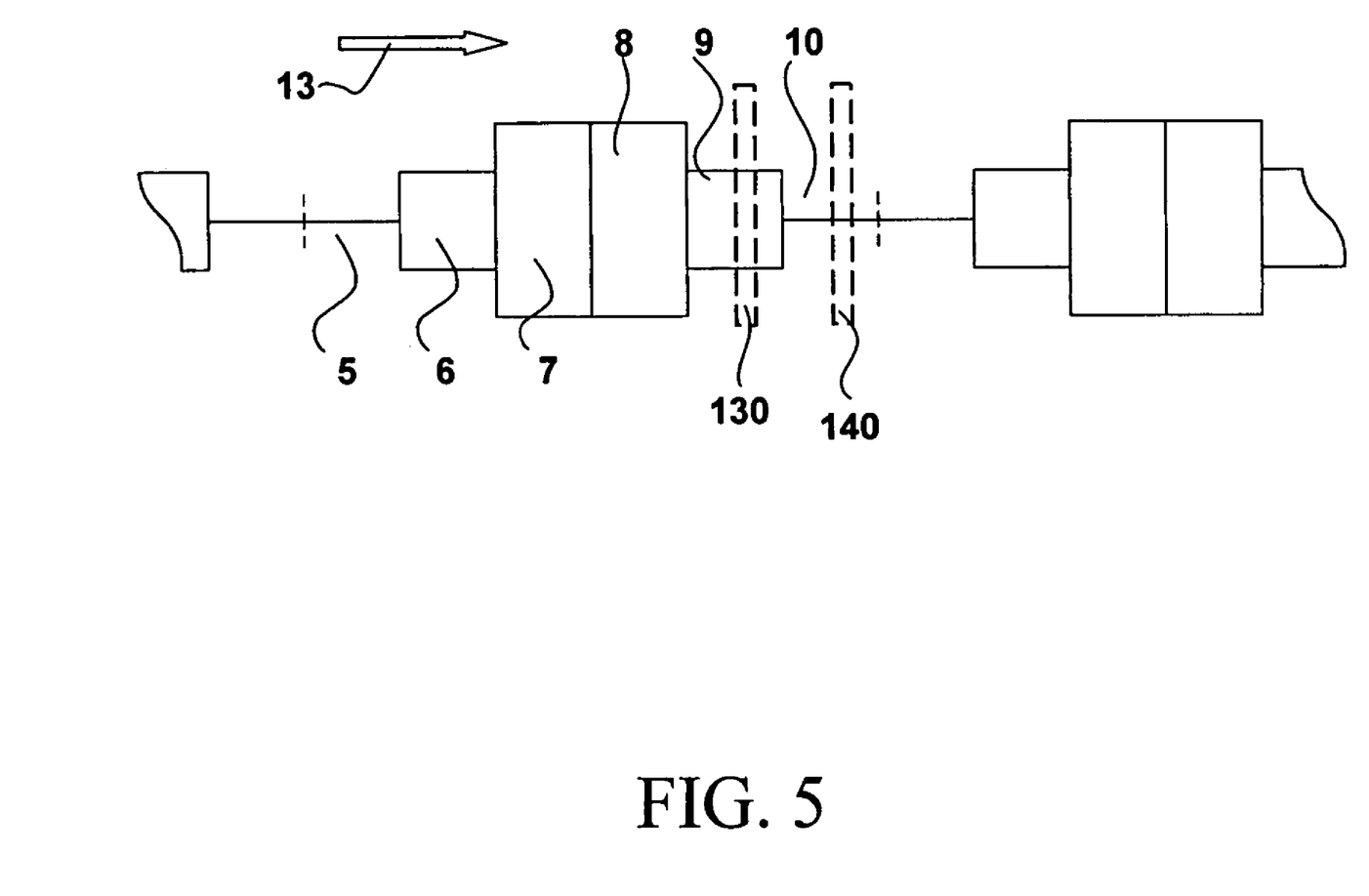
FIG. 5 is a schematic view of a portion of the code track pattern on the code wheel of the invention.

With reference to FIG. 5, we straighten the code track 112 of the code wheel 110 and only show part of it. According to the required groups, the code wheel 110 is provided with a first opening 5, a second opening 6, and a third opening 7, and in a symmetric pattern, a fourth opening, 8, a fifth opening 9, and a sixth opening 10. In particular, the first opening 5 and the sixth opening 10 are closed. The second opening 6 and the fifth opening 9 are one-unit openings. The third opening 7 and the fourth opening 8 are two-unit openings. Since if there is no way to determine the absolute positions of the six openings with only one photo sensor, we require two light sensors 130, 140 fixed on the base as the reference points.

In the following, we explain how we use the pattern change in the code track 112 of the code wheel 110 to achieve equivalent phase-changing signal output. As outlined in FIG. 6, the disclosed encoding method contains the following steps. First, the light emitter projects a beam of light on the code wheel (step 600). The code wheel either blocks the light or let the light go through. The two light sensors detect the light intensity (step 610). The system then receives the induced currents generated from the light intensity detected by the light sensors (step 620). The induced currents are converted into voltage signals (step 630), which is further transferred into a phase-changing signal (step 640). Finally, the system outputs the phase-changing signal (step 650).

Figure 6:
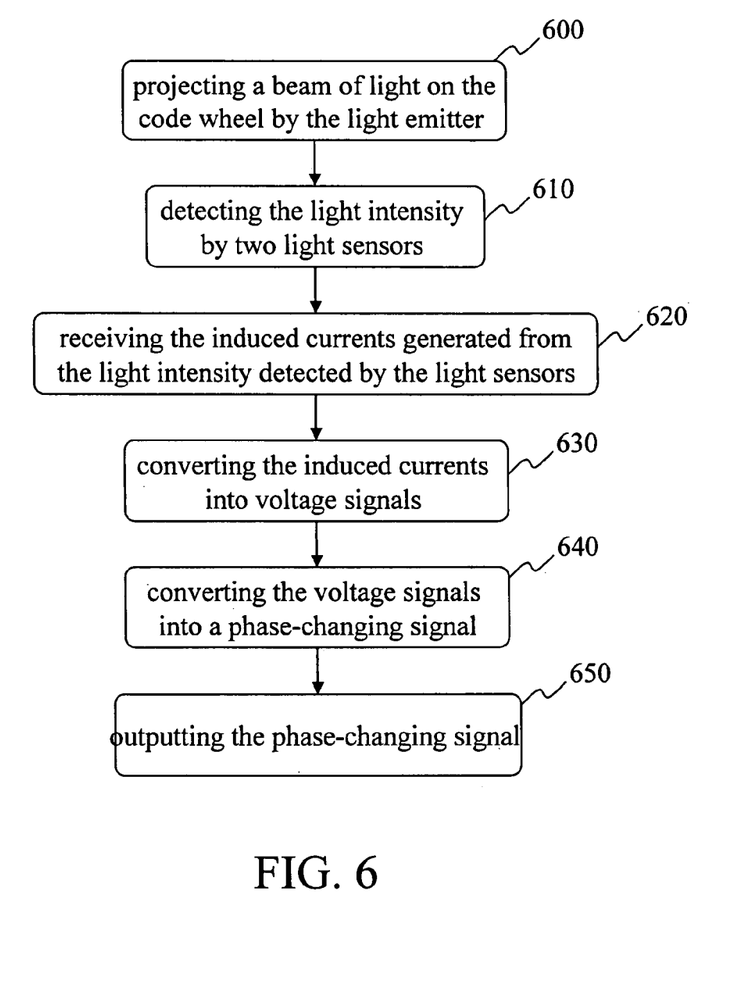
FIG. 6 is a flowchart of the disclosed encoding method for a rotary optical encoder.

As the code wheel 110 rotates with the rotor 510, the light sensors 130, 140 can detect variation in the light intensity projected from the light emitter 120 (step 600 610). If the code wheel rotates in the direction 13, the light intensity detected by the light sensors 130, 140 are in order (1,0), (2,1), (2,2), (1,2), (0,1), (0,0), (1,0) . . . . By monitoring the two light sensors 130, 140, one can determine the absolute positions of the rotor 510 in the group division.

Afterwards, the light intensity detected by the light sensors 130, 140 is converted into a phase-changing signal. We explain the implementation of the processing circuit in the invention as follows.

Figure 7:
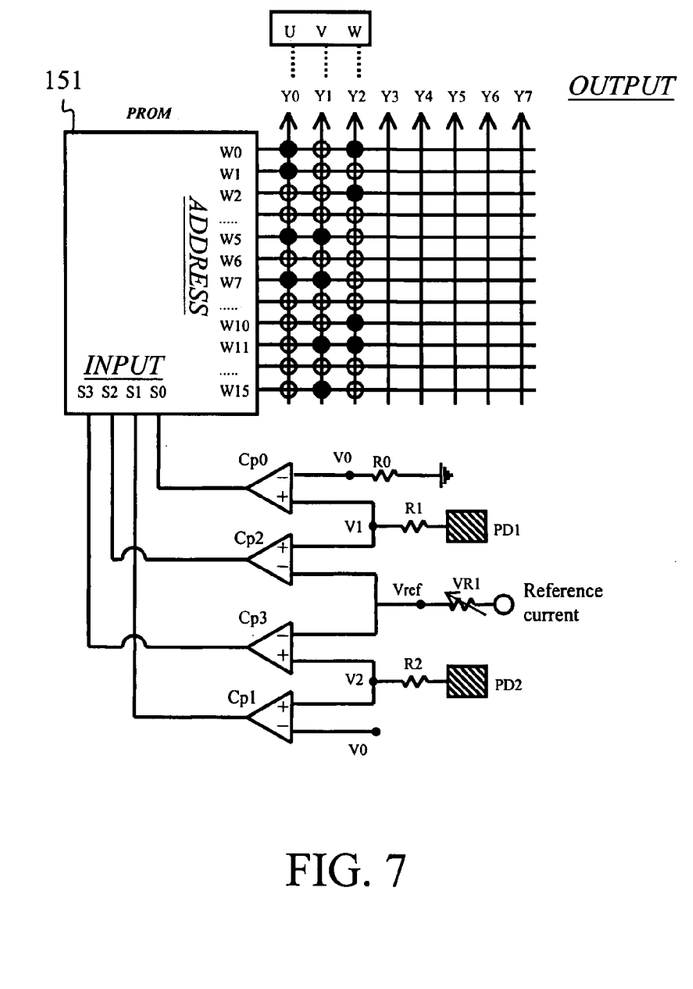
FIG. 7 is a schematic view of the processing circuit in the disclosed rotary optical encoder.

With reference to FIG. 7, the light intensity variation detected by the light sensors 130, 140 is 0, 1, 2. In order to effectively distinguish these three states, two references are needed. One of them is used to distinguish whether any light is detected; the other is used to distinguish the case of one-unit or two-unit light intensity. We use the photo diodes PD1, PD2 as the light sensors 130, 140. Induced currents are generated after receiving the light (step 620) and converted into a voltage through the serial resistors R1, R2 as the source voltage signals V1, V2 (step 630). In order to distinguish the variation in the signals, two reference voltages Vref and V0 are introduced. Vref has to be tuned properly so that its value is roughly equal to the voltage signal corresponding to the situation when the photo diodes PD1, PD2 receive 1.5 units of light. V0 is also properly tuned to be roughly equal to the voltage signal when the photo diodes PD1, PD2 do not detect any light (only the dark current).

Figure 8:
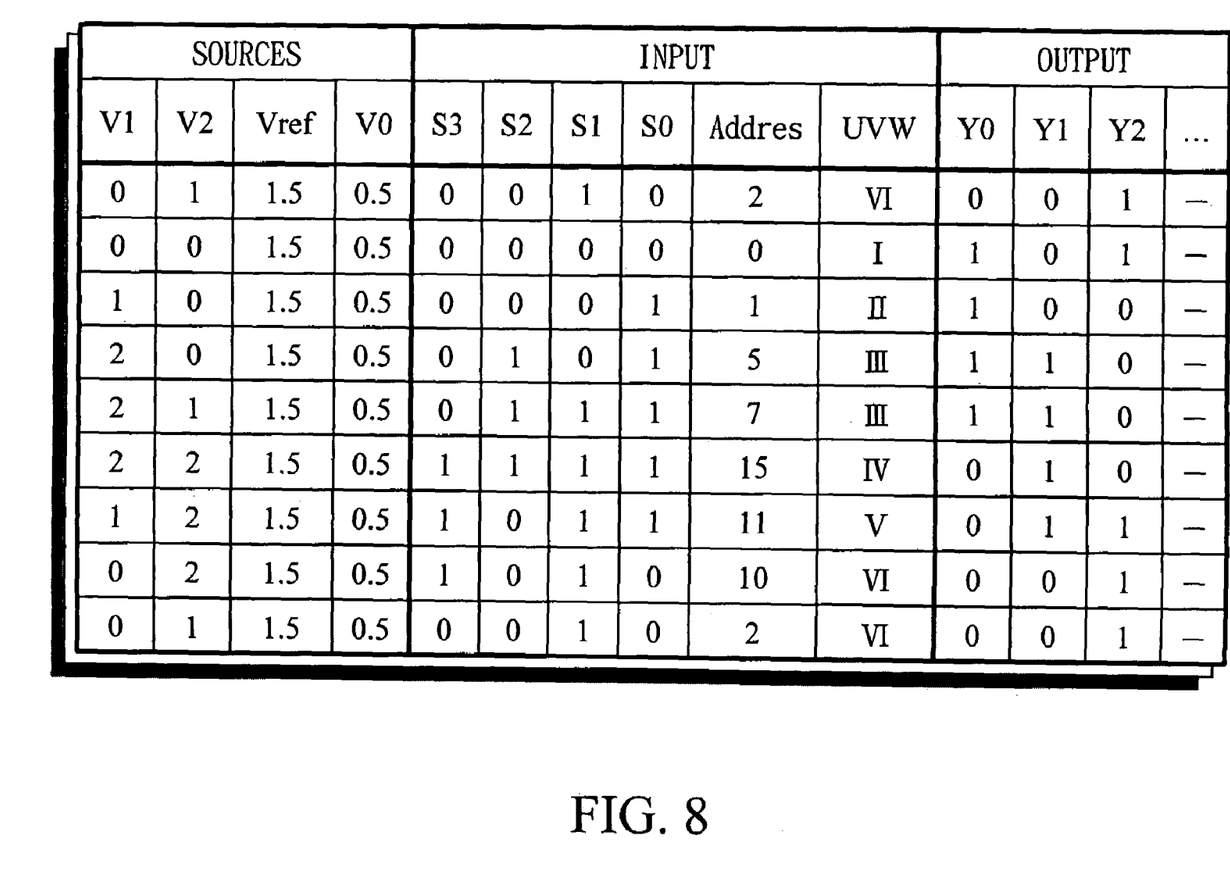
FIG. 8 shows the output data of the phase-changing signals.

The source voltage signals V1, V2 are compared with the reference voltages Vref, V0 to obtain the level range. In the invention, we use four comparators Cp0, Cp1, Cp2, and Cp3, whose output values are, respectively, S0=V1−V2, S1=V2−V0, S2=V1−Vref, and S3=V2−Vref. If the code track 112 of the code wheel 110 rotates in the direction 13, the signal output of the comparators Cp0, Cp1, Cp2, and Cp3 is shown in FIG. 8. We list two extra sets of signals (V1,V2)=(2,0) and (V1,V2)=(0,2) to take into account possible situations that the (V1,V2) signals switch from (1,0) to (2,1) and from (1,2) to (0,1) as the code track 112 rotates.

The position of the code wheel 110 can be determined from the internal signals (S3,S2,S1,S0). In order to provide the same phase-changing signal output as in the conventional rotary optical encoder, a converting circuit is provided between the internal signals (S3,S2,S1,S0) and the phase-changing signals (U,V,W). The converting circuit is provided by a code converter 151. The internal signals (S3,S2,S1,S0) are transferred by the code converter 151 into the phase-changing signals (U,V,W) (step 640) for output (step 650). The values stored inside the code converter 151 can be flexibly adjusted in practice. FIG. 8 shows the internal signals (S3,S2,S1,S0) obtained from different (V1,V2) values. The signals are used as the storage addresses of the code converter 151 for storing the output values of the corresponding phase-changing signals (U,V,W).

The code converter 151 uses programmable read only memory (PROM) for signal conversions. This can increase the flexibility for adjustment according to practical needs of the product under fixed hardware design.

Besides, the pattern on the code track of the code wheel includes parts that have no opening. Therefore, not all the material is removed. This is particularly suitable for metal code wheel because it does not need an extra support. Of course, one can use another code track pattern on the code wheel without departing from the spirit of the invention, as long as the light sensors can determine the absolute position of all the openings on the code track.

In summary, the invention provides a rotary optical encoder and its encoding method for outputting phase-changing signals. With only one additional code track with variation in openings on the code wheel along with two light sensors and a corresponding processing circuit, the required phase-changing signals can be obtained from a permanently magnetized motor. In comparison with the prior art, the invention can reduce the space for the encoder, the number of light sensors, and the space for the illumination source, providing a low-cost, small-volume, and more flexible rotary optical encoder.

Certain variations would be apparent to those skilled in the art, which variations are considered within the spirit and scope of the claimed invention.

What is claimed is:

1. A rotary optical encoder for outputting phase-changing signals in a permanently magnetized motor comprising a rotating axis and a rotor fixed thereon, the rotary optical encoder including:

a code wheel, which is coupled to the rotating axis and has a code track with a plurality of regions, each of which has a first non-transparent part, a first opening, a second opening, a third opening, a fourth opening, and a second non-transparent part, wherein the first non-transparent part, the first opening, and the second opening are symmetric to the second non-transparent part, the fourth opening, and the third opening respectively, the first opening and the fourth opening are one-unit openings, and the second opening and the third opening are two-unit openings;

a light emitter, which projects a beam of light on the code wheel;

two light sensors, which is located one side of the code wheel opposite to the light emitter for detecting the light intensity through the code wheel; and a processing circuit, which is connected to the light sensors to convert the light intensity into a phase-changing signal for output.

2. The rotary optical encoder of claim 1, wherein the light sensors are photo diodes.

3. The rotary optical encoder of claim 1, wherein the processing circuit has two reference levels, one of which being used to determine whether any light is detected and the other to determine the intensity of received light.

4. The rotary optical encoder of claim 1, wherein the processing circuit contains a plurality of serial resistors for converting the light intensity into a voltage signal.

5. The rotary optical encoder of claim 1, wherein the processing circuit contains a converting circuit to convert the voltage signal into a phase-changing signal.

6. The rotary optical encoder of claim 5, wherein the converting circuit is provided by a code converter.

7. The rotary optical encoder of claim 6, wherein the code converter uses programmable read only memory (PROM) for signal conversions.

8. A code wheel having a code track with a plurality of regions, each of which has a first non-transparent part, a first opening, a second opening, a third opening, a fourth opening, and a second non-transparent part; wherein the first non-transparent part, the first opening, and the second opening are symmetric to the second non-transparent part, the fourth opening, and the third opening respectively, the first opening and the fourth opening are one-unit openings, and the second opening and the third opening are two-unit openings.

9. An encoding method for a rotary optical encoder to output phase-changing signals from a permanently magnetized motor, the rotary optical encoder comprising a code wheel having a code track with a plurality of regions, each of which has a first non-transparent part, a first opening, a second opening, a third opening, a fourth opening, and a second non-transparent part, wherein the first non-transparent part, the first opening, and the second opening are symmetric to the second non-transparent part, the fourth opening, and the third opening respectively, the first opening and the fourth opening are one-unit openings, and the second opening and the third opening are two-unit openings, the encoding method comprising:

projecting a beam of light on the wheel from a light emitter;

using two light sensors to detect the light intensity through the code wheel;

receiving an induced current generated by the light sensors according to the detected light intensity;

converting the induced current into a voltage signal;

converting the voltage signal into a phase-changing signal; and outputting the phase-changing signal.

10. The encoding method of claim 9, wherein the light sensors are photo diodes.

11. The encoding method of claim 9, wherein the processing circuit has two reference levels, one of which being used to determine whether any light is detected and the other to determine the intensity of received light.

12. The encoding method of claim 9, wherein the step of converting the induced current into a voltage signal further contains the step of comparing a source voltage signal to a reference voltage to obtain the level range of the voltage signal.

13. The encoding method of claim 9, wherein the step of converting the voltage signal into a phase-changing signal further contains the step of a code converter's using the voltage signal as the storage address to store the output value of the corresponding phase-changing signal.

* * * * *